(12) United States Patent
Tsai et al.

(10) Patent No.: US 10,438,941 B2
(45) Date of Patent: Oct. 8, 2019

(54) SEMICONDUCTOR APPARATUS

(71) Applicant: UBIQ Semiconductor Corp., Hsinchu County (TW)

(72) Inventors: Yi-Yun Tsai, Hsinchu County (TW); Chih-Hung Chen, Hsinchu County (TW); Chin-Fu Chen, Hsinchu County (TW)

(73) Assignee: UBIQ Semiconductor Corp., Hsinchu County (TW)

(*) Notice: Subject to any disclaimer, the term of this patent is extended or adjusted under 35 U.S.C. 154(b) by 0 days.

(21) Appl. No.: 15/995,113

(22) Filed: May 31, 2018

(65) Prior Publication Data

US 2019/0244952 A1    Aug. 8, 2019

(30) Foreign Application Priority Data

Feb. 5, 2018    (TW) .............................. 107103915 A

(51) Int. Cl.
*H01L 27/02*      (2006.01)
*H01L 29/866*     (2006.01)

(52) U.S. Cl.
CPC ........ *H01L 27/0255* (2013.01); *H01L 29/866* (2013.01)

(58) Field of Classification Search
None
See application file for complete search history.

(56) References Cited

U.S. PATENT DOCUMENTS

| 5,059,831 A * | 10/1991 | Itoh ................... H03K 17/08112 257/536 |
| 5,689,133 A | 11/1997 | Li et al. |
| 6,580,121 B2 | 6/2003 | Hisamoto |
| 8,053,808 B2 | 11/2011 | Su et al. |
| 8,466,514 B2 | 6/2013 | Hsieh |
| 8,969,968 B2 * | 3/2015 | Ma ...................... H01L 27/0292 257/356 |
| 2008/0290367 A1 * | 11/2008 | Su ....................... H01L 27/0255 257/173 |
| 2013/0092976 A1 * | 4/2013 | Hsieh .................. H01L 27/0629 257/133 |
| 2018/0006013 A1 * | 1/2018 | Lin ..................... H01L 27/0248 |

* cited by examiner

*Primary Examiner* — Bo B Jang

(74) *Attorney, Agent, or Firm* — JCIPRNET

(57) ABSTRACT

A semiconductor apparatus including a substrate, an electrostatic discharge protection device, a resistor device, and a first metal layer is provided. The substrate defines a pad area and includes a first area and a second area. The first area has a recess, the second area is disposed in the recess, and the pad area is partially overlapped with the first area and the second area. The electrostatic discharge protection device is disposed in the first area of the substrate. The resistor device is disposed in the second area of the substrate. The first metal layer is disposed above and electrically connected to the electrostatic discharge protection device and the resistor device.

16 Claims, 8 Drawing Sheets

SEMICONDUCTOR APPARATUS

CROSS-REFERENCE TO RELATED APPLICATION

This application claims the priority benefit of Taiwan application serial no. 107103915, filed on Feb. 5, 2018. The entirety of the above-mentioned patent application is hereby incorporated by reference herein and made a part of this specification.

BACKGROUND OF THE INVENTION

1. Field of the Invention

The invention relates to a semiconductor apparatus, and more particularly, to a semiconductor apparatus having an electrostatic discharge protection device and a resistor device.

2. Description of Related Art

Electrostatic Discharge (abbr. ESD) protection devices have been widely used in the semiconductor field. An ideal electrostatic discharge protection device needs to provide characteristics of high current bearing capability, small layout area, high turn-on speed and appropriate safe operating area, so as to ensure that the electrostatic discharge protection device can provide instantaneous current bearing capability in a limited area resource.

Further, the wire of the gate resistor in the conventional technology is often pulled outside the transistor region, so the wire is prone to overheat or even burnout since the wire of the resistor may be too long and thin. On the other hand, because the wire of the gate resistor is disposed outside the transistor region, the overall layout area also becomes larger.

SUMMARY OF THE INVENTION

Accordingly, the invention is directed to a semiconductor apparatus capable of manufacturing an electrostatic discharge protection device with high current tolerance and small layout area in a pad area by utilizing the existing manufacturing process.

The invention provides a semiconductor apparatus, which includes a substrate, an electrostatic discharge protection device, a resistor device and a first metal layer. The substrate defines a pad area and includes a first area and a second area. The first area has a recess, the second area is at least partially disposed in the recess, and the pad area is partially overlapped with the first area and the second area. The electrostatic discharge protection device is disposed in the first area of the substrate. The resistor device is disposed in the second area of the substrate. The first metal layer is disposed above and electrically connected to the electrostatic discharge protection device and the resistor device.

According to an embodiment of the invention, the semiconductor apparatus further includes an insulation layer disposed above the electrostatic discharge protection device and the resistor device, and a first contact portion, a second contact portion and a third contact portion are disposed in the insulation layer.

According to an embodiment of the invention, the electrostatic discharge protection device has a ring shape structure with the recess, and the first contact portion is continuously ring-shaped and disposed on an inner side of the ring shape structure.

According to an embodiment of the invention, the electrostatic discharge protection device has a ring shape structure with the recess, and the third contact portion is C-shaped and disposed on an outer side of the ring shape structure.

According to an embodiment of the invention, the first metal layer is connected to the electrostatic discharge protection device through the first contact portion, the first metal layer is connected to the resistor device through the second contact portion, and a second metal layer is connected to the electrostatic discharge protection device through the third contact portion.

According to an embodiment of the invention, the electrostatic discharge protection device includes a plurality of first doped layers having a first conductivity type and disposed on the substrate, and a plurality of second doped layers having a second conductivity type and disposed on the substrate, the second conductivity type being opposite to the first conductivity type. The first doped layers and the second doped layers are alternately arranged.

According to an embodiment of the invention, each of the first doped layers and the second doped layers has a ring shape structure.

According to an embodiment of the invention, the first metal layer is electrically connected to the first doped layer away from the second area through the first contact portion, and a second metal layer is electrically connected to the first doped layer close to the second area through the third contact portion.

According to an embodiment of the invention, the resistor device includes a third doped layer having a first conductivity type and disposed on the substrate.

According to an embodiment of the invention, the first metal layer is electrically connected to the third doped layer through a second contact portion, and a third metal layer is electrically connected to the third doped layer through a fourth contact portion.

According to an embodiment of the invention, the second contact portion and the fourth contact portion are block-shaped.

According to an embodiment of the invention, the second contact portion and the fourth contact portion are strip-shaped.

According to an embodiment of the invention, the third doped layer includes a first end portion disposed close to the first area, a second end portion disposed away from the first area, and a connection portion connecting the first end portion and the second end portion. An extending direction of the first end portion and the second end portion is different from an extending direction of the connection portion.

According to an embodiment of the invention, the first metal layer is electrically connected to the first end portion of the third doped layer through a second contact portion, and a third metal layer is electrically connected to the second end portion of the third doped layer through a fourth contact portion.

According to an embodiment of the invention, the second contact portion and the fourth contact portion are strip-shaped.

According to an embodiment of the invention, the resistor device further includes a plurality of fourth doped layers having a second conductivity type and disposed on the substrate on two sides of the connection portion of the third doped layer.

Based on the above, the resistor device of the invention is disposed in the recess of the electrostatic discharge protection device to effectively reduce the layout area. Further, the resistance of the resistor device is adjusted by utilizing the size of N-type doping and P-type doping so the contact portion of the resistor device can have enough area for preventing the resistor device from burnout due to instantaneous over current. In addition, the electrostatic discharge protection device of the invention has a recess structure capable of increasing the area of a PN junction in a Zener diode, which can effectively increase the current bearing capability of the electrostatic discharge protection device.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
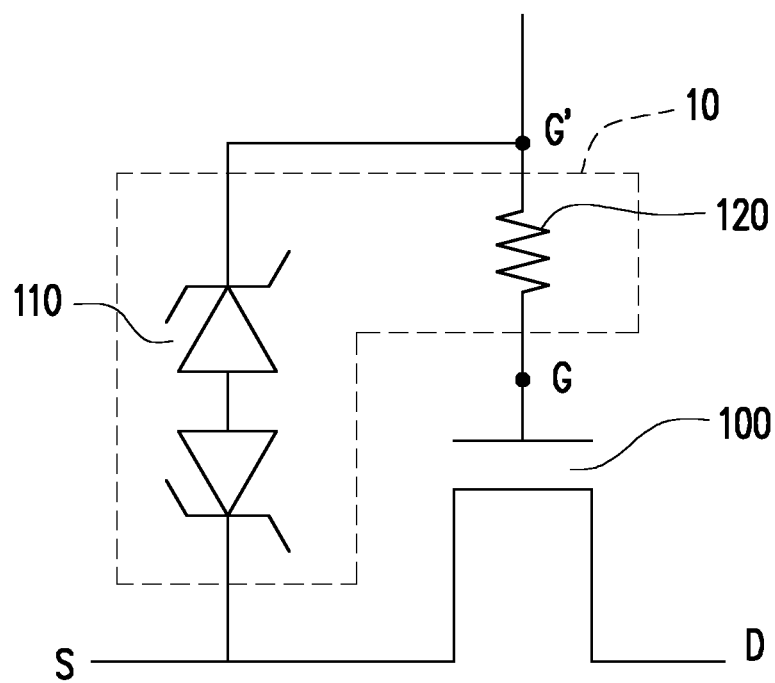
FIG. 1 is a circuit diagram of a semiconductor apparatus illustrated according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In the following embodiments, description is provided with a first conductive type being N-type and a second conductive type being P-type as an example, but the invention is not limited thereto. In another embodiment, the first conductivity type may be P-type and the second conductivity type may be N-type.

FIG. 1 is a circuit diagram of a semiconductor apparatus illustrated according to an embodiment of the invention. With reference to FIG. 1, a transistor 100 includes a gate G, a drain D and a source S. In an embodiment, the transistor 100 includes a metal-oxide-semiconductor field-effect transistor (abbr. MOSFET), but the type of the transistor 100 is not particularly limited by the invention. A semiconductor apparatus 10 includes an electrostatic discharge protection device 110 and a resistor device 120. The resistor device 120 and the parasitic capacitance of the transistor 100 can make an electrostatic signal be RC-delayed. In an embodiment, the electrostatic discharge protection device 110 is a back to back Zener diode, which is foiiried by two Zener diodes electrically connected in reverse, and is configured to sense an electrostatic discharge voltage and bear an electrostatic discharge current. In an embodiment, the resistor device 120 is a resistor having a dopant of a first conductivity type (N-type). In an embodiment, a first end of the electrostatic discharge protection device 10 is coupled to the source S of the transistor, a second end of the electrostatic discharge protection device 110 is coupled to a first end of the resistor device 120 (i.e., an external terminal G'), and a second end of the resistor device 120 is coupled to the gate G of the transistor 100.

The combination of the electrostatic discharge protection device 110 and the resistor device 120 of the invention may have the electrostatic discharge current bypassed in advance outside the transistor 100 to protect the transistor 100 from electrostatic damages. For instance, if the external terminal G' is connected to an electrostatic source and the source S is connected to a ground line, the path of the electrostatic discharge current may be directed from the electrostatic source of the external terminal G' to the ground line of the source S through the electrostatic discharge protection device 110. In this way, the electrostatic discharge current may be prevented from flowing into the gate G of the transistor 100 through the resistor device 120 so the transistor 100 does not lose its normal operation functionality.

Figure 2:
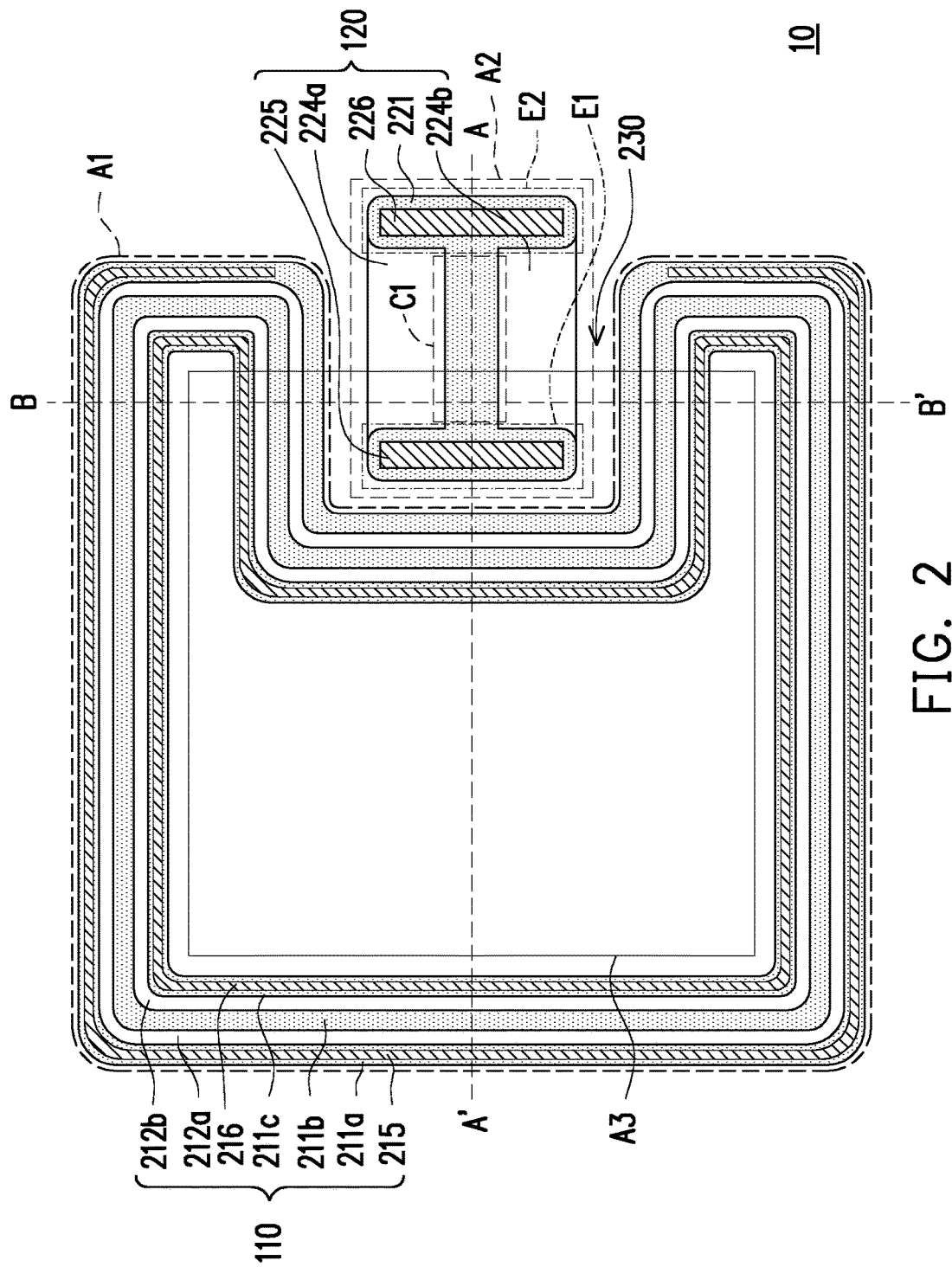
FIG. 2 is a simplified top view of a semiconductor apparatus illustrated according to an embodiment of the invention.
Figure 3:
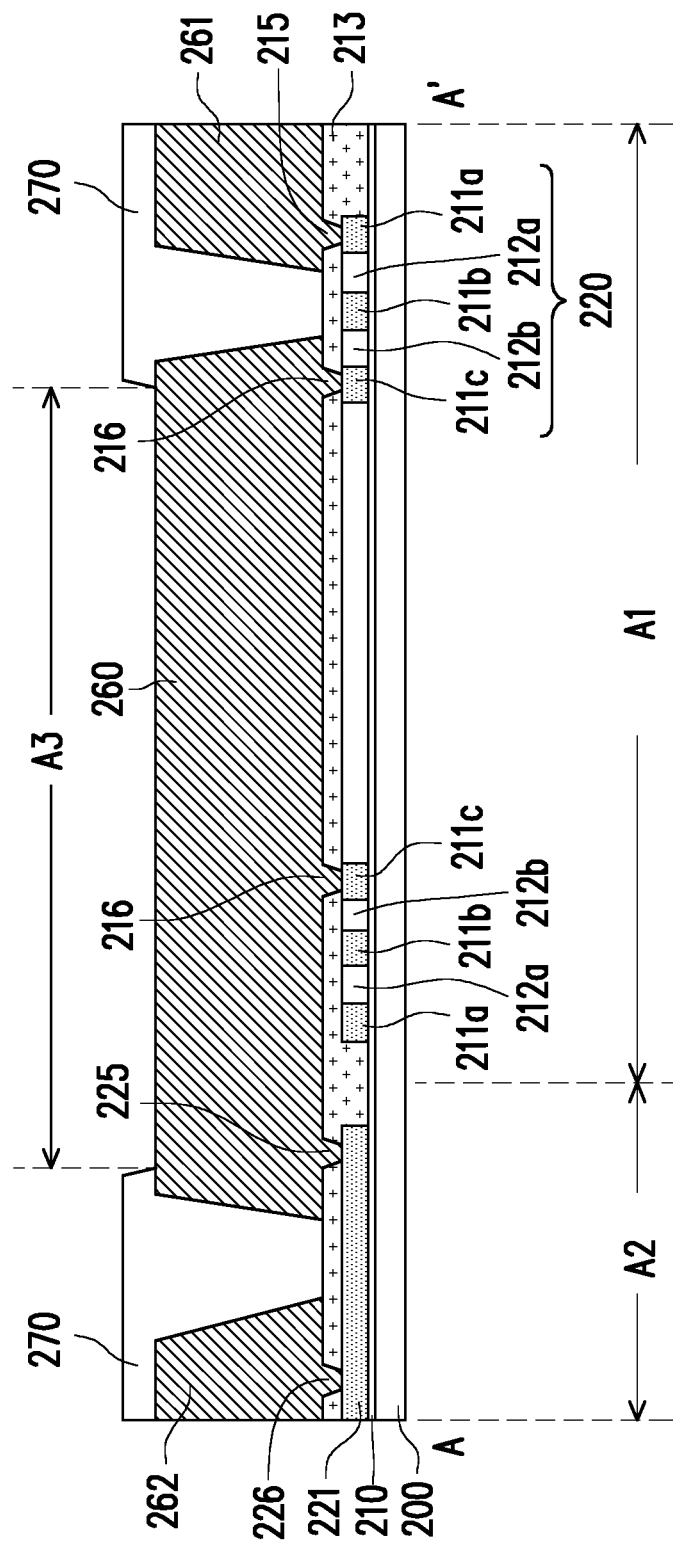
FIG. 3 is a cross-sectional view illustrated along a line A-A' of FIG. 2.
Figure 4:
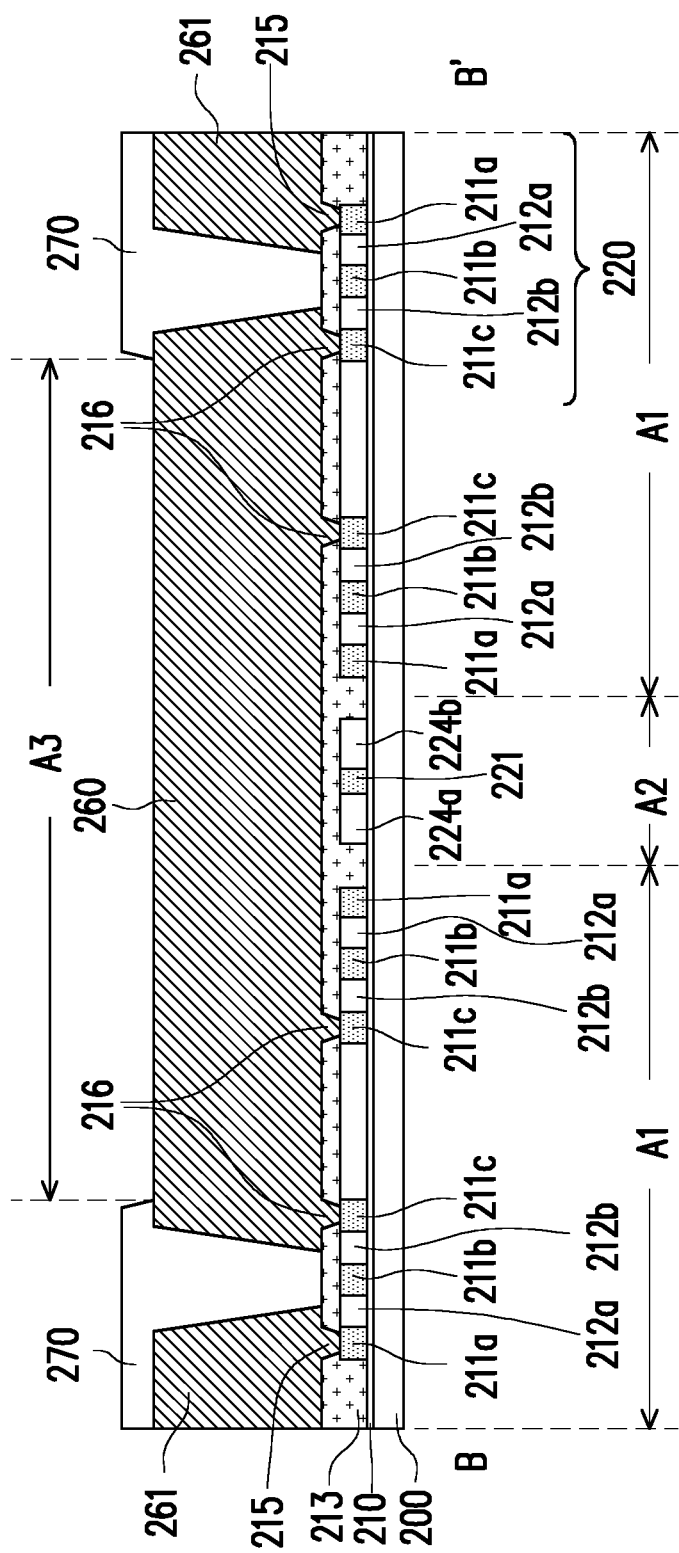
FIG. 4 is a cross-sectional view illustrated along a line B-B' of FIG. 2.

FIG. 2 is a simplified top view of a semiconductor apparatus illustrated according to an embodiment of the invention. FIG. 3 is a cross-sectional view illustrated along a line A-A' of FIG. 2. FIG. 4 is a cross-sectional view illustrated along a line B-B' of FIG. 2.

Referring to FIG. 2, FIG. 3 and FIG. 4, in an embodiment, the semiconductor apparatus 10 includes a substrate 200, an electrostatic discharge protection device 110, a resistor device 120, an insulation layer 213, a first metal layer 260, a second metal layer 261, a third metal layer 262, a first contact portion 216, a second contact portion 225, a third contact portion 215 and a fourth contact portion 226.

In an embodiment, the substrate 200 is a silicon substrate having a dopant of a second conductivity type (P-type). In addition, the substrate 200 defines a pad area A3, and the substrate 200 includes a first area A1 and a second area A2. In an embodiment, the first area A1 has a recess 230, and the second area A2 is at least partially disposed in the recess 230, as shown in FIG. 2.

In an embodiment, the electrostatic discharge protection device 110 is disposed in the first area A1 of the substrate 200, and the resistor device 120 is disposed in the second area A2 of the substrate 200. More specifically, the electrostatic discharge protection device 110 includes the recess 230, and the resistor device 120 is disposed in the recess 230. It is noted that, the electrostatic discharge protection device 110 needs to be designed as a sealed ring shape structure having the recess 230. If the ring shape structure of the electrostatic discharge protection device 110 is not sealed but having a gap, a current leakage will occur at the gap of the electrostatic discharge protection device 110 during electrostatic discharge.

In an embodiment, the electrostatic discharge protection device 110 has a polysilicon layer 220, and the polysilicon layer 220 and the substrate 200 are electrically insulated from each other by the insulation layer 210 therebetween. In an embodiment, the polysilicon layer 220 of the electrostatic discharge protection device 110 includes a plurality of first doped layers and a plurality of second doped layers. In an embodiment, the first doped layers are heavily doped with a dopant of the first conductivity type (N-type), and are disposed on the substrate 200. The first doped layers include a first doped layer 211a on the outermost side (e.g., close to the second area A2), a first doped layer 211b at the center, and a first doped layer 211c on the innermost side (e.g., away from the second area A2). In an embodiment, the second doped layers are heavily doped with a dopant of the second conductivity type (P-type), and are disposed on the substrate 200. The second doped layers include second doped layers 212a and 212b. In an embodiment, the first doped layers 211a, 211b and 211c and the second doped layers 212a and 212b are alternately arranged. Specifically, the second doped layer 212a is disposed between the first doped layers 211a and 211b, and the second doped layer 212b is disposed between the first doped layers 211b and 211c. In an embodiment, the conductivity type of the doped layer surrounded by the first doped layer 211c on the innermost side is different from the conductivity type of the first doped layer 211c.

In an embodiment, the resistor device 120 has a polysilicon layer, and the polysilicon layer and the substrate 200 are electrically insulated from each other by the insulation layer 210 therebetween. In an embodiment, the polysilicon layer of the resistor device 120 includes a third doped layer 221 and a plurality of fourth doped layers 224a and 224b. In an embodiment, the third doped layer 221 is heavily doped with a dopant of the first conductivity type (N-type), and is disposed on the substrate 200. The first to the fourth doped layers are made of the same material (e.g., polysilicon), in which only the dopant may be different depending on design requirements.

With reference to FIG. 2, the third doped layer 221 includes a first end portion E1, a second end portion E2 and a connection portion C1. The first end portion E1 is disposed on one end of the third doped layer 221 close to the first area A1, and the second end portion E2 is disposed on another end of the third doped layer 221 away from the first area A1. The connection portion C1 is disposed between the first end portion E1 and the second end portion E2, and is electrically connected to the first end portion E1 and the second end portion E2. In an embodiment, an extending direction of the first end portion E1 and the second end portion E2 is different from an extending direction of the connection portion C1. For instance, the extending direction of the first end portion E1 and the second end portion E2 is a longitudinal direction, and the extending direction of the connection portion C1 is a lateral direction. More specifically, from the top view, the third doped layer 221 is, for example, H-shaped.

In an embodiment, the fourth doped layers 224a and 224b are heavily doped with a dopant of the second conductivity type (P-type), and are disposed in the substrate 200 on two sides of the connection portion C1 of the third doped layer 221. The fourth doped layers 224a and 224b are configured to adjust the resistance of the resistor device 120 without increasing the layout area.

In an embodiment, referring to FIG. 1 and FIG. 3, the first metal layer 260 is connected to the electrostatic discharge protection device 110 through the first contact portion 216, and is connected to the resistor device 120 through the second contact portion 225. The second metal layer 261 is connected to the electrostatic discharge protection device 110 through the third contact portion 215. In an embodiment, the second metal layer 261 is a source metal layer. The third metal layer 262 is connected to the resistor device 120 through the fourth contact portion 226. In addition, the first contact portion 216, the second contact portion 225, the third contact portion 215 and the fourth contact portion 226 are disposed in the insulation layer 213.

In an embodiment, the first metal layer 260 is electrically connected to the first doped layer 211c on the innermost side, and the first contact portion 216 has the same metal material as the first metal layer 260.

The first metal layer 260 is electrically connected to the first end portion E1 of the third doped layer 221 through the second contact portion 225, and the second contact portion 225 has the same metal material as the first metal layer 260.

The second metal layer 261 is electrically connected to the first doped layer 211a on the outermost side through the third contact portion 215, and the third contact portion 215 has the same metal material as the second metal layer 261.

The third metal layer 262 is electrically connected to the second end portion E2 of the third doped layer 221 through the fourth contact portion 226, and the fourth contact portion 226 has the same metal material as the third metal layer 262.

In the invention, the first contact portion 216, the second contact portion 225, the third contact portion 215 and the fourth contact portion 226 may be designed as one single strip-shaped contact plug or a plurality of separate block-shaped contact plugs.

Figure 5:
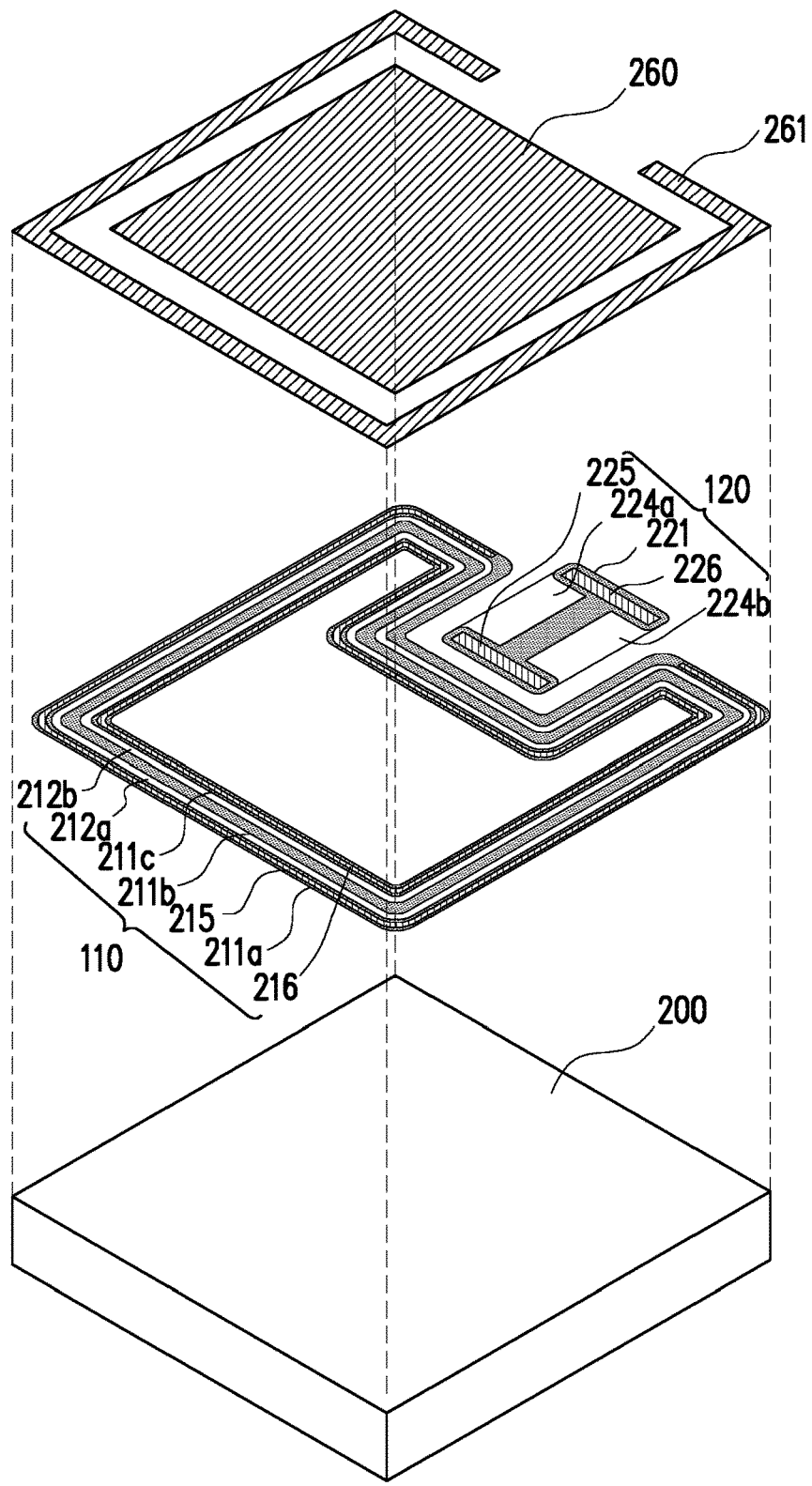
FIG. 5 is a three-dimensional explosion view of a semiconductor apparatus illustrated according to an embodiment of the invention.

FIG. 5 is a three-dimensional explosion view of a semiconductor apparatus illustrated according to an embodiment of the invention. With reference to FIG. 5, in an embodiment, the electrostatic discharge protection device 110 has a ring shape structure with a recess, the first contact portion 216 is continuously ring-shaped and disposed on an inner side of the ring shape structure, and the third contact portion 215 is C-shaped and disposed on an outer side of the ring shape structure. More specifically, the first contact portion 216 is distributed in a continuously ring shape, and is disposed on the first doped layer 211c on the innermost side of the electrostatic discharge protection device 110. The third contact portion 215 is distributed in a C-shape, and is disposed on the first doped layer 211a on the outermost side of the electrostatic discharge protection device 110.

Referring to FIG. 2 and FIG. 5, the third contact portion 215 has a C-shape distribution on a layout diagram so as to prevent a mistaken electrical connection between the electrostatic discharge protection device 110 and the resistor device 120. In an embodiment, with reference to FIG. 2 and FIG. 3, the first doped layer 211c on the innermost side of the electrostatic discharge protection device 110 is electrically connected to the third doped layer 221 of the resistor device 120 through the first contact portion 216, the first metal layer 260 and the second contact portion 225. This electrical connection is equivalent to the external terminal G' of FIG. 1, which allows the electrostatic discharge protection device 110 to be electrically connected to the resistor device 120.

Referring to FIG. 2, FIG. 3 and FIG. 5, from the top view, the first metal layer 260 covers a part of the electrostatic discharge protection device 110 and a part of the resistor device 120.

Referring to FIG. 2, FIG. 3 and FIG. 4, the pad area A3 is partially overlapped with the first area A1 and the second area A2. In an embodiment, the pad area A3 is an opening area of a passivation layer 270, and is configured to expose the first metal layer 260 for the subsequent wire bonding process so the first metal layer can be electrically connected to chip pins or other application circuits. The passivation layer 270 is configured to protect the surface of the semiconductor apparatus.

Figure 6:
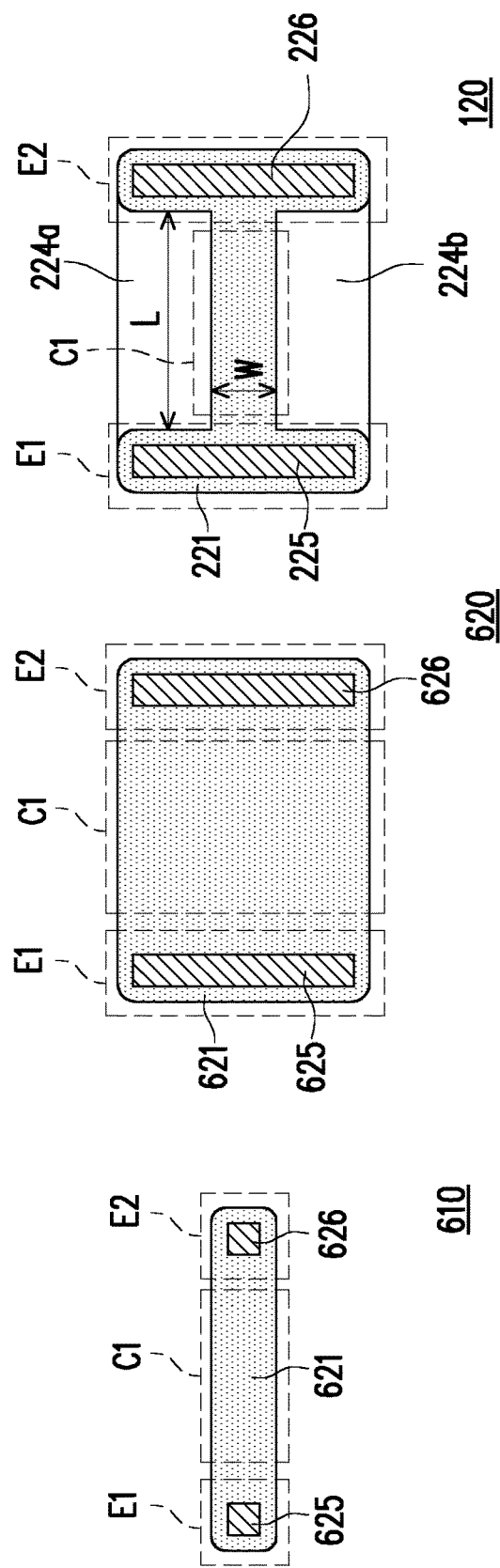
FIG. 6A is a simplified top view of a resistor device illustrated according to an embodiment of the invention.
FIG. 6B is a simplified top view of a resistor device illustrated according to another embodiment of the invention.
FIG. 6C is a simplified top view of a resistor device illustrated according to yet another embodiment of the invention.

Various possible structures of the resistor device of the invention are described as follows. FIG. 6A is a simplified top view of a resistor device illustrated according to an embodiment of the invention. FIG. 6B is a simplified top view of a resistor device illustrated according to another embodiment of the invention. FIG. 6C is a simplified top view of a resistor device illustrated according to yet another embodiment of the invention.

With reference to FIG. 6A, in an embodiment, a resistor device 610 includes a third doped layer 621. The third doped layer 621 is heavily doped with a dopant of the first conductivity type (N-type), and is disposed in the substrate 200. The third doped layer 621 includes a first end portion E1, a second end portion E2 and a connection portion C1. In an embodiment, widths of the first end portion E1, the second end portion E2 and the connection portion C1 are identical. In an embodiment, from the top view, the third doped layer 621 is, for example, horizontal I-shaped, and a second contact portion 625 and a fourth contact portion 626 may be designed as one single block-shaped contact plug and electrically connected to the first end portion E1 and the second end portion E2 of the third doped layer 621, respectively.

With reference to FIG. 6B, in an embodiment, a resistor device 620 includes a third doped layer 621, a second contact portion 625 and a fourth contact portion 626. The third doped layer 621 is heavily doped with a dopant of the first conductivity type (N-type), and is disposed in the substrate 200. The third doped layer 621 includes a first end portion E1, a second end portion E2 and a connection portion C1. In an embodiment, widths of the first end portion E1, the second end portion E2 and the connection portion C1 are identical. In an embodiment, from the top view, the third doped layer 621 is, for example, rectangle-shaped, and the second contact portion 625 and the fourth contact portion 626 may be designed as one single strip-shaped contact plug and electrically connected to the first end portion E1 and the second end portion E2 of the third doped layer 621, respectively.

With reference to FIG. 6C, in an embodiment, a resistor device 120 includes a third doped layer 221, a plurality of fourth doped layers, a second contact portion 225 and a fourth contact portion 226. The third doped layer 221 is heavily doped with a dopant of the first conductivity type (N-type), and is disposed in the substrate 200. The third doped layer 221 includes a first end portion E1, a second end portion E2 and a connection portion C1. The fourth doped layers are heavily doped with a dopant of the second conductivity type (P-type), and are disposed on the substrate 200. The fourth doped layers include a fourth doped layer 224a and a fourth doped layer 224b. In an embodiment, the fourth doped layer 224a and the fourth doped layer 224b are located on two sides of the connection portion C1 of the third doped layer 221, respectively. In an embodiment, from the top view, the third doped layer 221 is, for example, H-shaped, and the second contact portion 225 and the fourth contact portion 226 may be designed as one single strip-shaped contact plug and electrically connected to the first end portion E1 and the second end portion E2 of the third doped layer 221, respectively.

Referring to FIG. 6A, FIG. 6B and FIG. 6C, the connection portion C1 of the resistor device 620 has a width greater than that of the resistor device 610, so the resistance of the resistor device 620 is relatively smaller than that of the resistor device 610, and the RC delay provided by the resistor device 620 is smaller than that of the resistor device 610. Besides, the connection portion C1 of the resistor device 120 has a width W smaller than that of the resistor device 620, so the resistance of the resistor device 120 is relatively larger than that of the resistor device 620, and the RC delay provided by the resistor device 620 is greater than that of the resistor device 120.

The resistor device 120 has fourth doped layers 224a and 224b on the two sides of the connection portion C1, which are configured to adjust the width W of the connection portion of the resistor device 120 in order to adjust the resistance of the resistor device 120. Therefore, given the same total area, the resistor device 120 has a larger resistance relative to the resistor device 620 so a larger RC delay can be provided.

In the invention, the length L and the width W of the connection portion C1 in the resistor device 120 are adjustable and configured to provide the appropriate resistance. Specifically, the width W of the connection portion may be adjusted according to widths of the fourth doped layers 224a and 224b in the resistor device 120, and the length L of the connection portion is also adjustable to provide a resistor design that is flexible and area-saving for the user.

Figure 7:
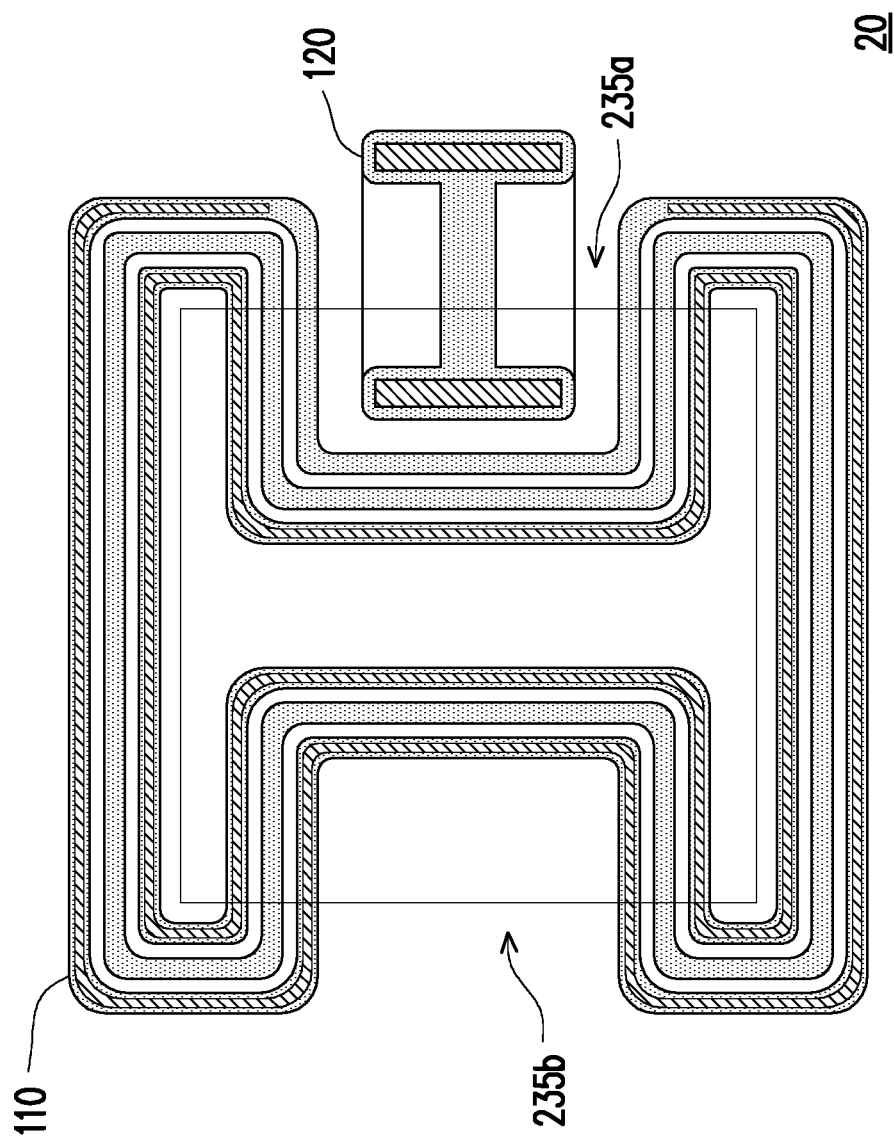
FIG. 7 is a simplified top view of a semiconductor apparatus illustrated according to another embodiment of the invention.

FIG. 7 is a simplified top view of a semiconductor apparatus illustrated according to another embodiment of the invention. With reference to FIG. 7, an electrostatic discharge protection device 110 in a semiconductor apparatus 20 includes a recess 235a and a recess 235b. In an embodiment, the resistor device 120 is disposed in the recess 235a. In comparison with the semiconductor apparatus 10 of FIG. 2, the semiconductor apparatus 20 of FIG. 7 has multiple recesses, so the area of a PN junction of the semiconductor apparatus 20 becomes larger. Therefore, the electrostatic discharge bearing capability of the electrostatic discharge protection device 110 may be increased.

Figure 8:
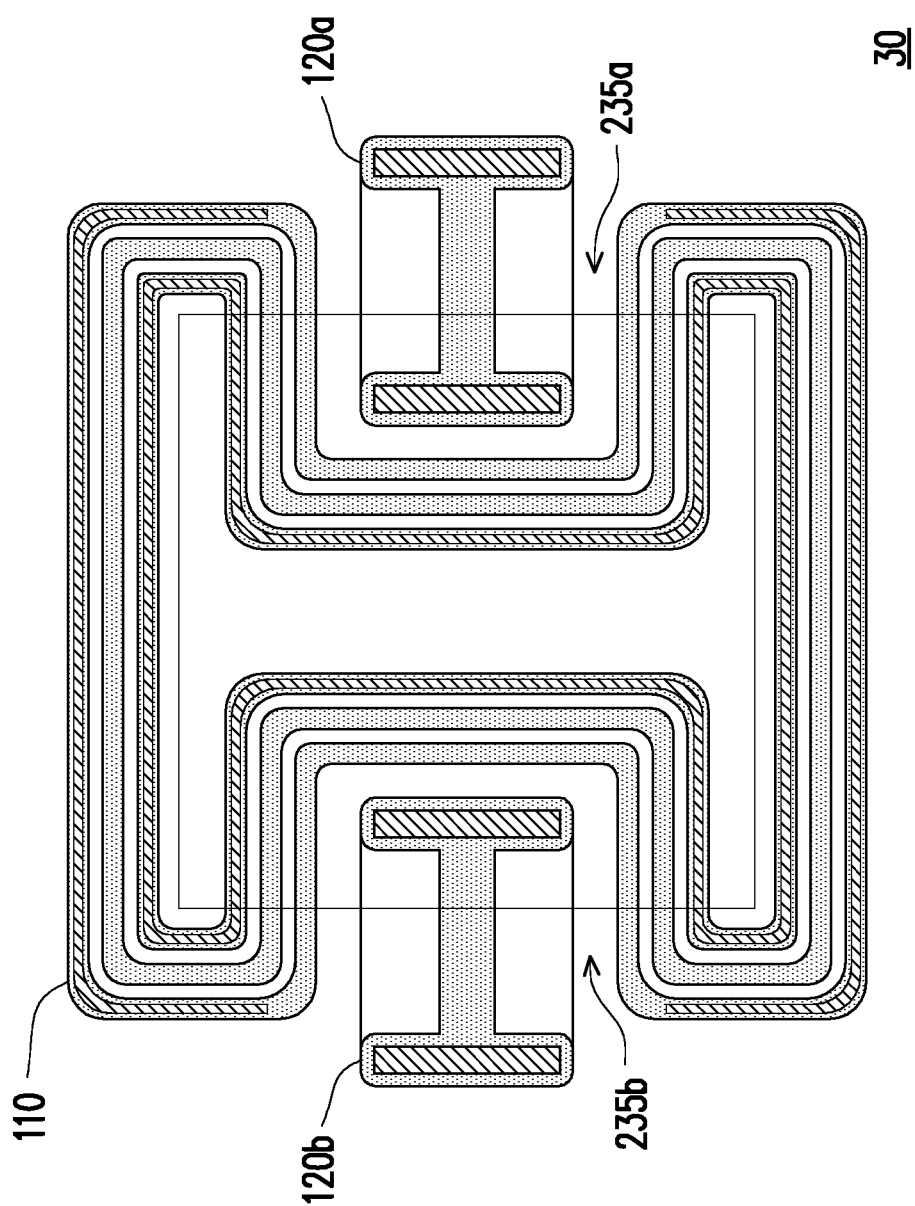
FIG. 8 is a simplified top view of a semiconductor apparatus illustrated according to another embodiment of the invention.

FIG. 8 is a simplified top view of a semiconductor apparatus illustrated according to another embodiment of the invention. With reference to FIG. 8, an electrostatic discharge protection device 110 in a semiconductor apparatus 30 includes a recess 235a and a recess 235b. In another embodiment, a resistor device 120a is placed in the recess 235a and a resistor device 120b is placed in the recess 235b. In comparison with the semiconductor apparatus 20 of FIG. 7, the semiconductor apparatus 30 has the resistor device 120a and the resistor device 120b to share the electrostatic discharge protection device 110 for protecting the transistor, so the layout area may be saved.

In conventional technology, the layout area is larger and the electrostatic discharge protection capability is limited because the wire of the resistor device is overly long and the PN junction is smaller. However, such issues are not observed in the semiconductor apparatus of the invention. More specifically, according to the layout structure of the invention, a resistor device is placed in a recess of the electrostatic discharge protection device and the resistor device is able to provide a larger resistance given the same total area, so the total apparatus area may be saved and the electrostatic discharge bearing capability may be increased.

Based on the above, the structure of the semiconductor apparatus of the invention has a faster response time and a simpler device design. Moreover, with the smaller layout area, the electrostatic discharge protection capability may be improved without changing the manufacturing process, so as to effectively enhance the product competitiveness.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A semiconductor apparatus, comprising:
   a substrate, defining a gate pad area;
   an electrostatic discharge protection device, having a closed ring structure with a recess;
   a resistor device, disposed in the recess of the closed ring structure; and
   a first metal layer, disposed above and electrically connected to the electrostatic discharge protection device and the resistor device,
   wherein the gate pad area is partially overlapped with the electrostatic discharge protection device and the resistor device.

2. The semiconductor apparatus of claim 1, further comprising:
   an insulation layer, disposed above the electrostatic discharge protection device and the resistor device, wherein a first contact portion, a second contact portion and a third contact portion are disposed in the insulation layer.

3. The semiconductor apparatus of claim 2, wherein the first contact portion is continuously ring-shaped and disposed on an inner side of the ring shape structure.

4. The semiconductor apparatus of claim 2, wherein the third contact portion is C-shaped and disposed on an outer side of the ring shape structure.

5. The semiconductor apparatus of claim 2, wherein the first metal layer is connected to the electrostatic discharge protection device through the first contact portion, the first metal layer is connected to the resistor device through the second contact portion, and a second metal layer is connected to the electrostatic discharge protection device through the third contact portion.

6. The semiconductor apparatus of claim 1, wherein the electrostatic discharge protection device comprises:
   a plurality of first doped layers, having a first conductivity type and disposed on the substrate; and
   a plurality of second doped layers, having a second conductivity type and disposed on the substrate, the second conductivity type being opposite to the first conductivity type,
   wherein the first doped layers and the second doped layers are alternately arranged.

7. The semiconductor apparatus of claim 6, wherein each of the first doped layers and the second doped layers has a ring shape structure.

8. The semiconductor apparatus of claim 6, wherein the first metal layer is electrically connected to one of the plurality of first doped layers away from the resistor device through the first contact portion, and a second metal layers is electrically connected to another one of the plurality of first doped layers close to the resistor device through the third contact portion.

9. The semiconductor apparatus of claim 1, wherein the resistor device comprises a third doped layer having a first conductivity type and disposed on the substrate.

10. The semiconductor apparatus of claim 9, wherein the first metal layer is electrically connected to the third doped layer through a second contact portion, and a third metal layer is electrically connected to the third doped layer through a fourth contact portion.

11. The semiconductor apparatus of claim 10, wherein the second contact portion and the fourth contact portion are block-shaped.

12. The semiconductor apparatus of claim 10, wherein the second contact portion and the fourth contact portion are strip-shaped.

13. The semiconductor apparatus of claim 9, wherein the third doped layer comprises:
   a first end portion, disposed close to the electrostatic discharge protection device;
   a second end portion, disposed away from the electrostatic discharge protection device; and
   a connection portion, connecting the first end portion and the second end portion,
   wherein an extending direction of the first end portion and the second end portion is different from an extending direction of the connection portion.

14. The semiconductor apparatus of claim 13, wherein the first metal layer is electrically connected to the first end portion of the third doped layer through a second contact portion, and a third metal layer is electrically connected to the second end portion of the third doped layer through a fourth contact portion.

15. The semiconductor apparatus of claim 14, wherein the second contact portion and the fourth contact portion are strip-shaped.

16. The semiconductor apparatus of claim 13, wherein the resistor device further comprises a plurality of fourth doped layers having a second conductivity type and disposed on the substrate on two sides of the connection portion of the third doped layer.

* * * * *